US006236618B1

United States Patent
Roy

(12) United States Patent
(10) Patent No.: US 6,236,618 B1
(45) Date of Patent: May 22, 2001

(54) CENTRALLY DECODED DIVIDED WORDLINE (DWL) MEMORY ARCHITECTURE

(75) Inventor: Richard Roy, Danville, CA (US)

(73) Assignee: Virage Logic Corp., Fremont, CA (US)

( * ) Notice: Subject to any disclaimer, the term of this patent is extended or adjusted under 35 U.S.C. 154(b) by 0 days.

(21) Appl. No.: 09/542,033

(22) Filed: Apr. 3, 2000

(51) Int. Cl.[7] .................................................... G11C 8/00
(52) U.S. Cl. ................... 365/230.06; 365/230.03
(58) Field of Search .................. 365/230.03, 230.06, 365/185.23, 51, 63

(56) References Cited

U.S. PATENT DOCUMENTS 5,621,690 * 4/1997 Jungroth ........................... 365/230.03
5,732,040 * 3/1998 Yabe .................................. 365/230.03

* cited by examiner

*Primary Examiner*—A. Zarabian
(74) *Attorney, Agent, or Firm*—Smith, Danamraj & Youst, P.C.

(57) ABSTRACT

A divided wordline memory architecture for memory compilers wherein a main memory array is organized into a plurality of local memory arrays. A plurality of local wordline decoders are provided such that each local memory array is associated with a local wordline decoder for selecting local wordline segments. Main wordline signals are generated based on a first portion of wordline address signals in a main wordline decoder provided as an integrated centrally located decoder structure. A combination of Plane signals, Set signals, or both, which are generated in the integrated centrally located decoder structure, are provided to the local wordline decoder in conjunction with a portion of the main wordline signals for selecting a local wordline segment based on a select main wordline signal and one of a select Plane signal, a select Set signal, or a combination of both.

23 Claims, 4 Drawing Sheets

CENTRALLY DECODED DIVIDED WORDLINE (DWL) MEMORY ARCHITECTURE

BACKGROUND OF THE INVENTION

1. Technical Field of the Invention

The present invention relates generally to semiconductor memories, and more particularly, to compilers for semiconductor memories with divided word lines and local wordline decoding circuitry disposed centrally in a memory instance.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that analog blocks, non-volatile memory, random access memories (RAMs), and other "non-logic" cells are being required. The gap in available silicon capacity versus design productivity means that without some fundamental change in methodology, it will take hundreds of staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. It is also well known that the existing memory compilers are adequate for designing low density memory arrays e.g., 32 kbit, 64 kbit memories, etc. However, as arrays get larger for higher density by increasing in the X-direction (by adding additional columns or bitlines), Y-direction (by adding additional rows or wordlines), or both, parameters such as RC time delay, etc., which have a deleterious effect on the performance of a memory circuit, become significant in both directions of an array. Accordingly, it is common practice in the memory design art to segment the array in the Y-direction in order to provide additional sense amplifiers and associated column circuitry at predetermined locations across the memory array. That is, for every predetermined number of rows of wordlines, a horizontal band or strip of sense amplifier/column circuitry is provided along the Y-direction of the array. Consequently, the RC delay effects in the Y-direction are mitigated because the total length of bitline per sense amplifier is considerably reduced. This practice of segmenting the array vertically is sometimes referred to as "banking."

It is also known in the art to segment the wordlines in order to reduce the RC delay effects along the X-direction of the array. Typically, a local wordline decoder is provided at specific locations in the memory array along the X-direction which receives main wordline signals from a main row decoder. The main wordline signals are then decoded by the local wordline decoder in order to select a particular local row or wordline (or, sub-word line). This scheme is known in the industry as the "divided wordline" or DWL architecture.

Although advances such as those described above attempt to address the RC delay effects in large memory arrays, banking and DWL techniques have not been implemented together in the context of memory compilers which provide re-usable, tilable memory circuitry (preferably on a per I/O basis) for designing an array of an arbitrary size with a variable number of I/Os. Furthermore, it should be appreciated by those skilled in the art that the existing DWL techniques are beset with several deficiencies and shortcomings. First, current DWL architectures are unwieldy for memory circuits that employ dummy wordlines and/or dummy bitlines for ensuring certain signal levels on the active bitlines before the sense amplifiers read the data. It should be apparent that as the array expands in the X-direction, electrical characteristics of segmented wordlines in the main array, i.e., wordlines divided into main wordlines and local wordlines, cannot be accurately matched by the dummy wordlines without incurring area penalty due to additional control logic.

Moreover, as the array expands in the X-direction, tracking control logic signals on electrical paths that span the width of the array and are typically routed over highly variable circuit layout/geometry becomes very difficult. Accordingly, it would be highly advantageous to segment the control/peripheral circuitry into smaller units that provide tightly controlled signals for shorter spans of the array. However, such an arrangement requires additional area which the present memory architectures cannot accommodate.

SUMMARY OF THE INVENTION

Accordingly, the present invention advantageously provides a divided wordline memory architecture for memory compilers wherein a main memory array is organized into a plurality of local memory arrays. A plurality of local wordline decoders are provided such that each local memory array is associated with a local wordline decoder for selecting local wordline segments. Main wordline signals are generated from a first portion of a plurality of wordline address signals in a main wordline decoder provided as an integrated centrally located decoder structure. In one exemplary embodiment, a plurality of Plane signals are generated using a second portion of the wordline address signals in the integrated centrally located decoder structure, which Plane signals are provided to the local wordline decoder in conjunction with the main wordline signals. Using another portion of the wordline address signals, logic circuitry provided in the local wordline decoder selects a local wordline segment based on a select main wordline signal and a select Plane signal. The selected local wordline is preferably coupled to half of the memory cells in the row associated therewith, thereby realizing considerable savings in power.

In a second exemplary embodiment, a plurality of Set signals are generated using a portion of the wordline address signals in the integrated centrally located decoder structure.

Main wordline signals and Set signals are provided to the local wordline decoder wherein a local wordline is selected based on a select main wordline signal and a select Set signal. In a third exemplary embodiment, both Set signals and Plane signals provided by the integrated centrally located decoder structure are utilized in the local wordline decoding circuitry such that a segment of the local wordline is selected based on a select main wordline signal, a select Set signal, and a select Plane signal, resulting in significant power savings. By providing sense amplifier and column circuitry bands horizontally, and by means of vertically-placed the local wordline decoders, areas in the bands are created such that control logic circuitry associated with a select local memory array may be placed therein. Accordingly, such localized control circuitry provides better controllability of signals on a per I/O basis for a memory compiler.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
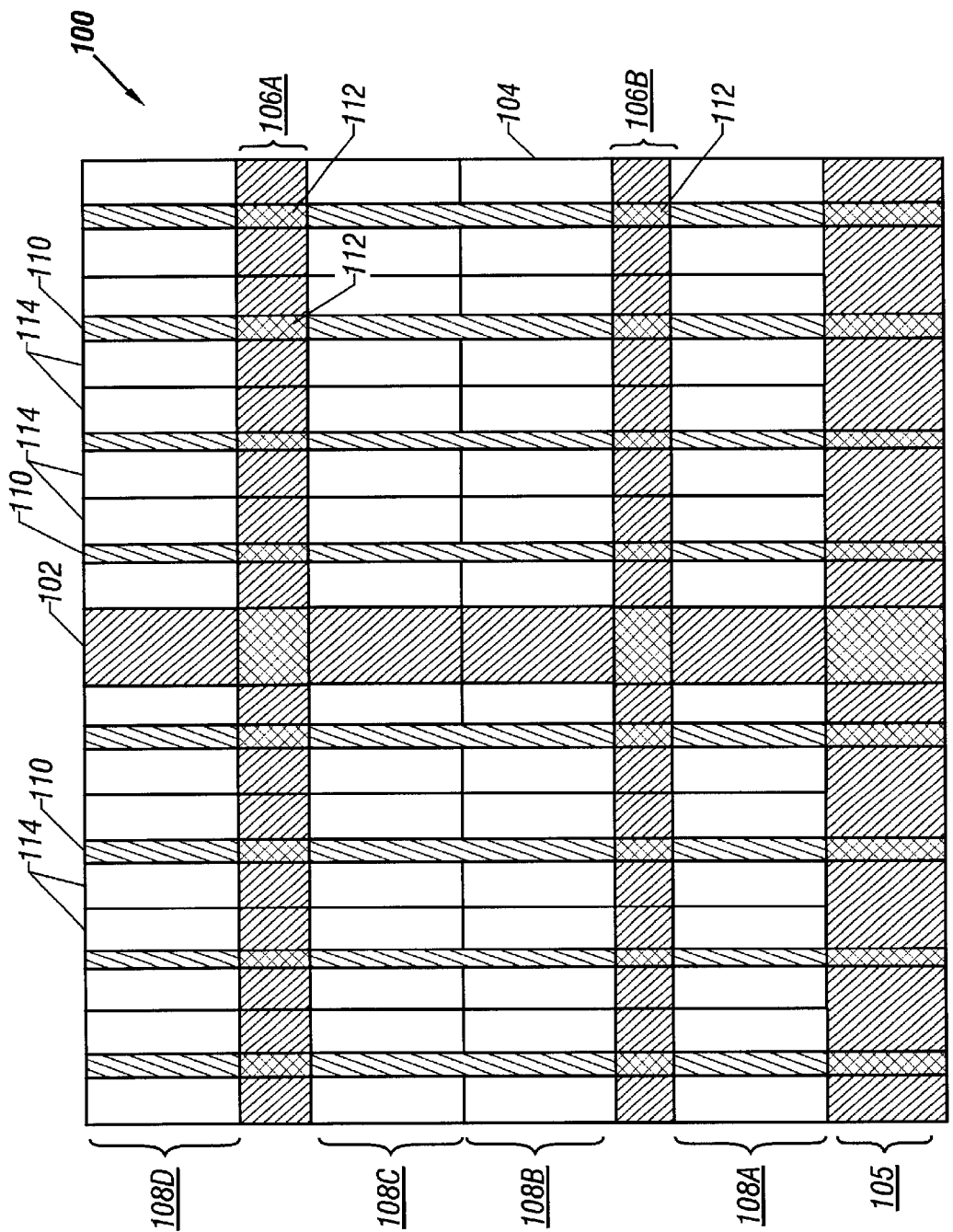
FIG. 1 is a physical architectural view of a presently preferred exemplary embodiment of a memory compiler for a memory circuit having a divided wordline scheme provided in accordance with the teachings of the present invention.

In the drawings, like or similar elements are designated with identical reference numerals throughout the several views thereof, and the various elements depicted are not necessarily drawn to scale. Referring now to FIG. 1, depicted therein is a physical architectural view of a presently preferred exemplary embodiment of a memory circuit 100 having a divided wordline scheme provided in accordance with the teachings of the present invention. Reference numerals SA 106A and SA 106B exemplify a plurality of bands of sense amplifier/column drive circuitry which segment the main array 104 of the memory circuit 100 in the Y-direction into a plurality of banks, e.g., Bank-00 108A to Bank-11 108D. Additional column and peripheral circuitry 105 is provided at the bottom of the main array 104. A main wordline (WL) decoder 102 is preferably included in the memory circuit 100 as an integrated centrally located decoder structure for decoding at least a portion of row address signals in order to generate main wordline (MWL) signals which are provided to a plurality of local wordline decoders, e.g., local WL decoder 110, disposed in the array 104. Furthermore, the integrated centrally located decoder structure also provides additional signals described hereinbelow for local wordline selection in accordance with the teachings of the present invention.

Those skilled in the art should readily appreciate upon reference hereto that the local WL decoders 110 segment the array 104 vertically along the X-direction such that the main array 104 may be visualized as an orderly composition of a plurality of local arrays, e.g., local array 114, bounded by the local WL decoders and bands of sense amplifier circuitry. Accordingly, a memory bank of the circuit 100 (e.g., Bank-11 108D) may be seen as comprising a sub-plurality of such local arrays arranged horizontally next to one another along the X-direction. As will be described in greater detail hereinbelow, the local WL decoders are provided with a portion of row address signals and certain decoded row select control signals, in addition to the MWL signals, in order to select particular local wordlines or a segment thereof in accordance with the teachings of the present invention.

Figure 2:
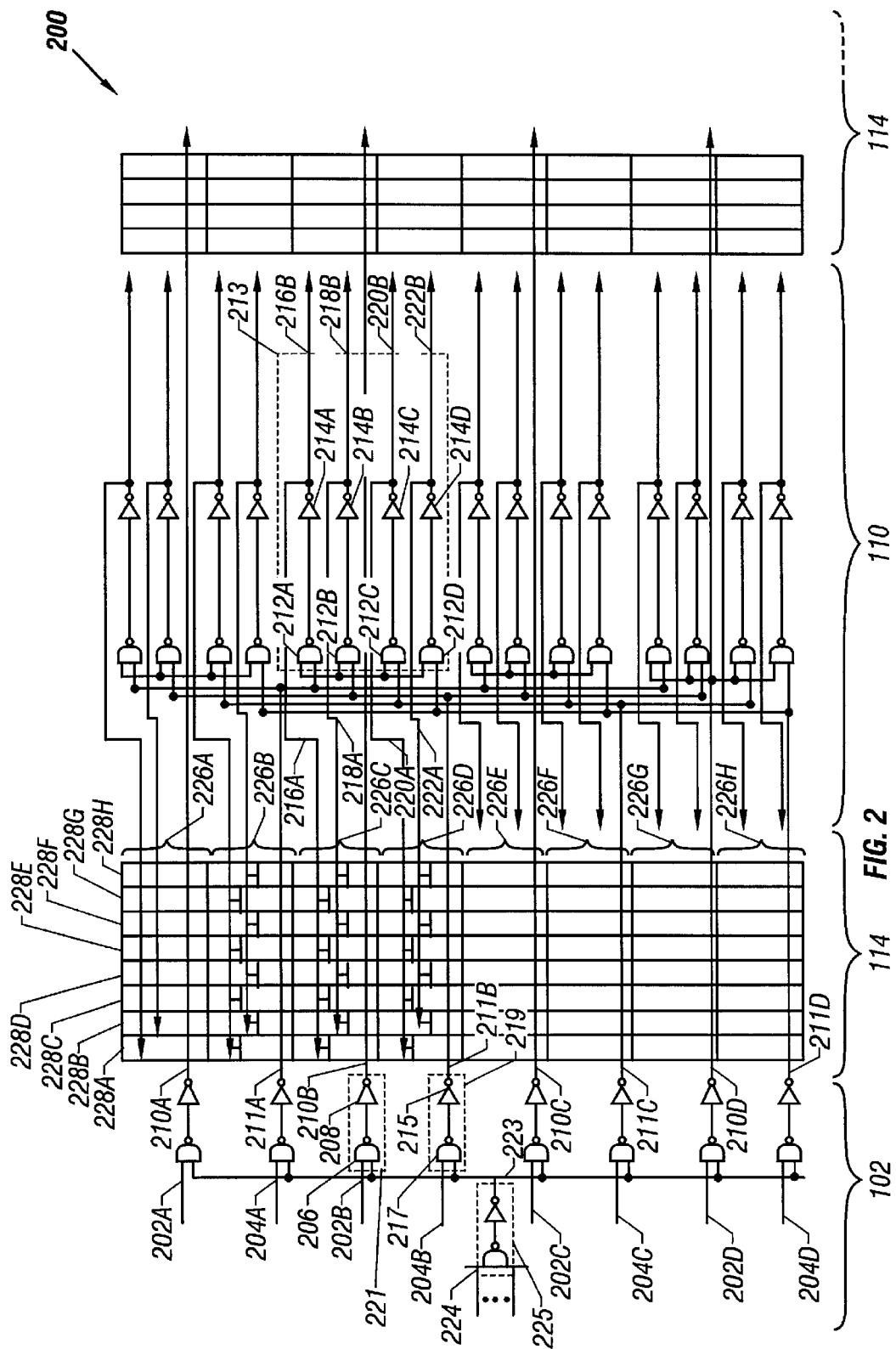
FIG. 2 depicts a first presently preferred exemplary embodiment of the divided wordline scheme of the present invention.

Referring now to FIG. 2, depicted therein is a first presently preferred exemplary embodiment of the divided wordline scheme of the present invention. A memory circuit portion 200 including the main WL decoder 102, local arrays 114, and the local WL decoder 110 is illustrated. It should be apparent to those skilled in the art that a plurality of memory circuit portions 200 may be arranged together to form the memory circuit 100 of FIG. 1.

A portion of the local array 114, comprising eight columns or bitlines (reference numerals 228A–228H) and eight rows (reference numerals 226A–226H), is particularly exemplified. The local WL decoder 110 and the two 8-bit wide local arrays 114 may comprise a repeating unit that may preferably be associated with a single I/O. Accordingly, a plurality of such repeating units may be compiled together for designing a memory circuit of an arbitrary number of I/Os. As will be seen hereinbelow, the local WL decoder 110 advantageously selects only half of the memory cells of a local wordline, thereby reducing the power consumption on a per I/O basis (because only half of the cells provide memory cell current to the bitlines).

A plurality of MWL signals (e.g., MWL1 202A–MWL4 202D) and a plurality of Plane signals (e.g., Plane1 204A–Plane4 204D) are formed in the main WL decoder (i.e., integrated centrally located decoder structure) 102 from select portions of row address signals (not shown). In a presently preferred exemplary embodiment of the circuit portion 200, four Plane signals are provided as a repeating unit in the vertical direction of the array such that the four Plane signals and sets of four MWL signals (which may be sequentially numbered by using a binary counter) may be provided to local WL decoders to cover the array from top to bottom.

In the embodiment shown in FIG. 2, four MWL signals, MWL1 202A–MWL4 202D, and four Plane signals, Plane1 204A–Plane4 204D, are particularly exemplified. A select portion of the row address signals 224 is provided to a logic block 225, preferably comprising a NAND/inverter gate combination, whereby a decoded signal 223 is driven high for a particular combination of the row address signal portion 224. In accordance with the teachings of the present invention, each of the Plane and MWL signals is combined with the decoded signal 223 in a separate logic block. For example, a logic block 221, comprising a NAND gate 206 and an inverter 208, is provided for combining MWL2 signal 202B with the decoded signal 223. Similarly, a logic block 219, comprising a NAND gate 217 and an inverter 215, is provided for combining Plane2 signal 204B with the decoded signal 223.

Continuing to refer to FIG. 2, each of the logic blocks described above, e.g., logic block 219 and logic block 221, drives either a main wordline or a Plane line which are provided to the local WL decoder circuitry 110. In the circuit portion 200, four main wordlines, 210A–210D, and four Plane lines, 211A–211D, are illustrated. By way of example, logic block 221 drives the main wordline 210B and logic block 219 drives the Plane line 211B. As those skilled in the art should readily appreciate, when both MWL2 signal 202B and the decoded signal 223 are high, logic block 221 drives the main wordline 210B high also. In similar fashion, when Plane2 signal 204B and the decoded signal 223 are high, logic block 219 drives the Plane line 211B high as well.

The general operation of the circuitry comprising the local WL decoder 110 for selecting local wordlines of the memory circuit portion 200 may now be described in detail. Essentially, each main wordline is provided to a corresponding logic block in the local WL decoder 110 such that it is decoded into four local wordlines by the logic block, and which particular one of the four local wordlines is pulled high (i.e., selected) is dependent upon the Plane lines which are also provided to the logic block as inputs. Taking particular reference to the main wordline 210B and the Plane line 211B by way of example, the main wordline 210B is coupled to the logic block 213 comprising four sub-blocks of NAND/inverter combinations. Accordingly, NAND gates 212A–212D and inverters 214A–214D are illustrated, wherein each inverter drives a "left" local wordline select path and a "right" local wordline select path. For example, inverter 214A drives local wordline select paths 216A and 216B; inverter 214B drives local wordline select paths 218A and 218B; inverter 214C drives local wordline select paths 220A and 220B; and inverter 214D drives local wordline select paths 222A and 222B.

Each of the four Plane lines, 211A–211D, is connected to an input of the corresponding NAND gate of the sub-blocks provided in logic block 213. For example, the Plane line 211B is coupled to one of the inputs of the NAND gate 212B. Accordingly, when both main wordline 210B and Plane line 211B are driven high by logic blocks 221 and 219, respectively, in the main WL decoder 102, the output of the NAND gate 212B is low. Consequently, the inverter 214B generates a logic high signal on the local wordline paths 218A and 218B.

In a presently preferred exemplary embodiment of the memory circuit portion 200, each local wordline path is connected to only half of the memory cells of the row it is associated with. The remaining memory cells in that row are connected to an adjacent local wordline path. That is, each row of memory cells is associated with two local wordline paths wherein the cells are alternately connected to one local wordline path or the other. For example, local array row 226C is provided with local wordline paths 216A and 218A such that four of the eight memory cells in that row are selectable by pulling the local wordline path 216A and the other four are selectable by pulling the local wordline path 218A. Those skilled in the art should appreciate that whether the first four or the other four memory cells are pulled high is dependent, therefore, upon which of the Plane lines is pulled high—which, in turn, is dependent upon the signal inputs to the associated logic block, e.g., logic block 219, in the main WL decoder and row address signal portion 224.

It should be apparent upon reference hereto that the DWL scheme provided in this exemplary embodiment advantageously achieves power reduction on a per I/O basis (in addition to the reduction of wordline RC delay effects due to the divided wordlines) because the number of memory cells selected per I/O is reduced by half. Furthermore, this advantageous feature is achieved without incurring any area penalty by alternately providing main wordlines and Plane lines for the rows of the memory array. That is, the area of each row of memory cells is provided with either a main wordline or a Plane line—for example, main wordline 210A is routed over row 226A and Plane line 211A is routed over the next row, i.e., row 226B, and so on. Further, although the main wordlines are alternately provided, the local WL decoder circuitry 110 of the present invention allows individual row selection because of architectural symmetry.

Figure 3:
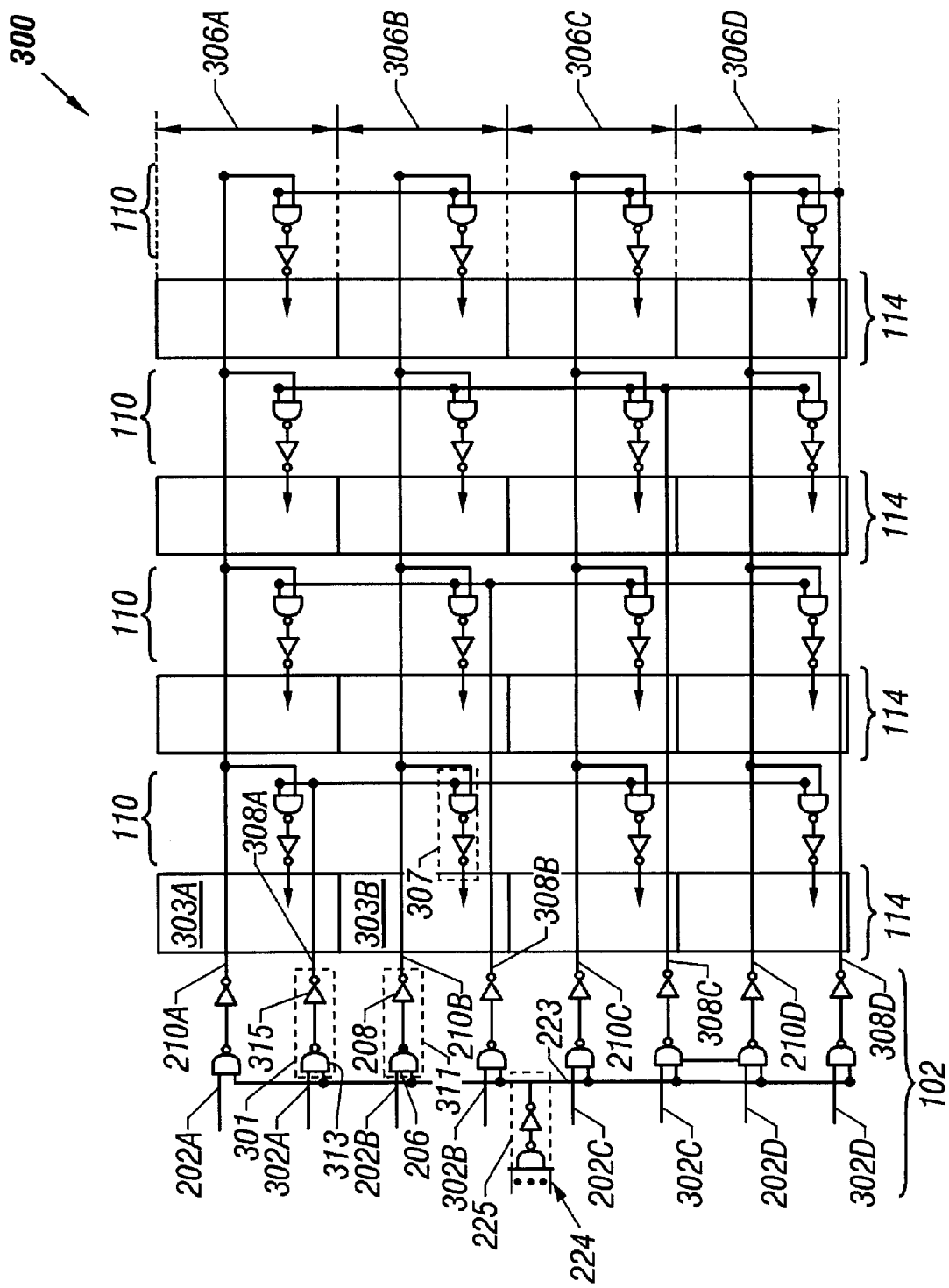
FIG. 3 depicts a second presently preferred exemplary embodiment of the divided wordline scheme of the present invention.

Referring now to FIG. 3, depicted therein is a second presently preferred exemplary embodiment of the DWL scheme of the present invention. A memory circuit portion 300 including the main WL decoder 102, and a plurality of local arrays 114 and local WL decoders 110 is illustrated. The local WL decoders are interposed between the local arrays such that a plurality of memory circuit portions 300 may be arranged together to form the memory circuit 100 of FIG. 1.

Those skilled in the art should readily appreciate that most of the logic circuitry used in the main WL decoder and local WL decoders in this exemplary embodiment is substantially similar to the circuitry described in detail hereinabove with respect to the first exemplary embodiment shown in FIG. 2. Accordingly, only the salient features of the memory circuit portion 300 and its general operation are set forth hereinbelow.

The memory circuit portion 300 is exemplified with four rows 306A–306D and a plurality of bitlines. These rows are divided into four local segments (i.e., sub-words) by the local WL decoders 110 such that the plurality of bitlines are organized into four separate local arrays 114. Accordingly, each rectangular block, e.g., 303A, of a local array represents a particular local row segment of multiple memory cells, e.g., 16, 32, etc.

A plurality of Set signals, e.g., Set1 302A–Set4 302D, are used in conjunction with the MWL signals 202A–202D in appropriate logic blocks so as to drive main wordlines 210A–210D and Set lines 308A–308D which are provided to the local WL decoders 110. The logic circuitry of the local WL decoders then appropriately drives a local WL select path in order to select one of the local row segments, e.g., block 303A, block 303B, etc.

Analogous to the first exemplary embodiment described hereinabove, the MWL and Set signals are generated by decoding select portions of the row address signals in the main WL decoder 102. Also, the decoded signal 223 is similarly produced on the basis of the row address signal portion 224. As can be seen in FIG. 3, the decoded signal 223 is gated with MWL signals or Set signals separately in appropriate logic blocks to drive a particular main wordline or Set line. A select combination of the main wordline and Set line is decoded by the local WL decoder to pull a particular local WL select path high.

The decoding operation of the exemplary memory circuit portion 300 may be described in greater detail using MWL2 202B signal and Set1 302A signal by way of example. When the decoded signal 223 is high (due to a particular logic combination appearing on the row address signal portion 224) and Set1 302A is high, a logic block 309 (comprising NAND gate 313 and inverter 315 coupled thereto) drives the Set line 308A high. In similar fashion, when the decoded signal 223 and MWL2 202B are high, a logic block 311 (comprising NAND gate 206 and inverter 208) drives the main wordline 210B high.

The Set line 308A and main wordline 210B are provided as inputs to logic block 307 (which comprises a NAND/inverter combination) in the local WL decoder 110 and, accordingly, when both inputs are high, the output of the logic block 307 is also high, thereby selecting the local row segment 303B of the row 306B provided in the memory circuit portion 300. It should be apparent to those skilled in the art that each combination of the four main wordlines and four Set lines (16 combinations in total) thus selects a corresponding local row segment of the memory array portion depicted in FIG. 3.

Figure 4:
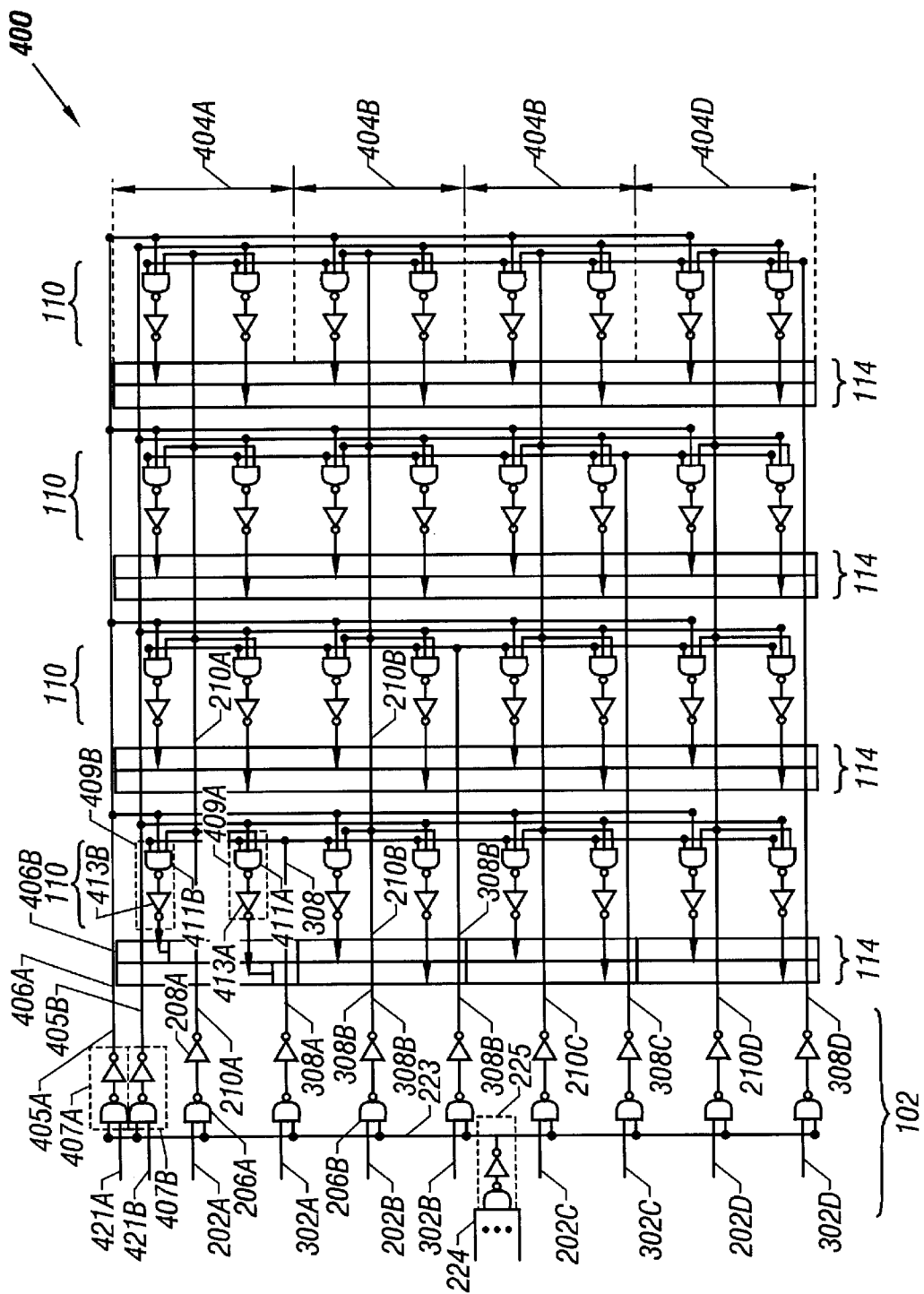
FIG. 4 depicts a third presently preferred exemplary embodiment of the divided wordline scheme of the present invention.

FIG. 4 depicts a third presently preferred exemplary embodiment of the DWL scheme of the present invention. A memory circuit portion 400 including the main WL decoder 102, and a plurality of local arrays 114 and local WL decoders 110 is illustrated. The local WL decoders are interposed between the local arrays such that a plurality of memory circuit portions 300 may be arranged together to form the memory circuit 100 of FIG. 1.

Again, those skilled in the art should readily appreciate that most of the logic circuitry used in the main WL decoder and local WL decoders in this exemplary embodiment is substantially similar to the circuitry described in detail hereinabove with respect to the exemplary embodiments shown in FIGS. 2 and 3. Furthermore, as may be readily seen in FIG. 4, the exemplary memory circuit portion 400 utilizes the innovative features of both first and second embodiments such that local arrays are preferably provided as independently selectable banks by using combinational logic involving MWL, Set, and Plane signals. Accordingly, only the salient features of the memory circuit portion 400 and its general operation are set forth hereinbelow.

The memory circuit portion 400 is exemplified with four rows 404A–404D and a plurality of bitlines. Similar to the memory circuit portion 300 shown in FIG. 3, these rows are divided into four local segments (i.e., sub-words) by the local WL decoders 110 such that the plurality of bitlines are organized into four separate local arrays 114. Each local segment is further provided as two independently selectable portions. Accordingly, each rectangular block, e.g., 406A, 406B, of a local array represents a particular row portion of multiple memory cells, e.g., 8 cells, 16 cells, 32 cells, etc., that is independently selectable.

The main WL decoder 102 generates MWL, Set and Plane signals using appropriate portions of the row address signals. The decoded signal 223 is similarly manufactured from the select row address signal portion 224 by using the logic block 225 as described hereinabove. The decoded signal 223 is gated to each of the MWL signals, Set signals and each of the Plane signals using separate NAND/inverter logic blocks. For example, Plane-0 421 A signal and the decoded signal 223 are provided to a logic block 407A for driving a Plane line 405A. In similar fashion, Plane-1 421B signal and the decoded signal 223 are provided to a logic block 407B for driving a Plane line 405B.

The decoded signal 223 is gated to the Set and MWL signals as described in the foregoing discussion in reference to FIG. 3 such that the main wordlines and Set lines are appropriately driven by the corresponding NAND/inverter logic blocks. The local WL decoder circuitry 110 comprises a plurality of logic blocks, e.g., logic block 409A and logic block 409B, each of which contains a 3-input NAND gate and an inverter coupled thereto. Each logic block is coupled to, accordingly, a suitable combination of: one of the four main wordlines 210A–210D, one of the four Set lines 308A–308D, and one of the two Plane lines 405A and 405B, which are provided as inputs to the 3-input NAND gate thereof. The signal combination is decoded to select one of the two independently selectable row portions of the local array.

By way of example, logic block 409A includes 3-input NAND gate 411A whose output is provided to inverter 413A. Analogously, logic block 409B includes 3-input NAND gate 411B whose output is provided to inverter 413B. As can be readily seen from FIG. 4, NAND gate 411A is driven by main wordline 210A, Set line 308A, and the Plane line 405B. Accordingly, when these three lines are driven high by the appropriate logic, the output of the inverter 413A of the logic block 409A is also driven high, thereby selecting only the memory cells of row portion 406A. In similar fashion, NAND gate 411B of the logic block 409B is driven by main wordline 210A, Set line 308A, and the Plane line 405A. The output of the inverter 413B of the logic block 409B is therefore driven high when the three inputs are pulled high. Consequently, only the plurality of memory cells comprising the local row portion or segment 406B are selected.

It should be apparent to those skilled in the art upon reference hereto that the main wordlines are used to select one of the rows (i.e., 404A–404D), the Set lines are used to select one of the local arrays 114, and the Plane lines are used to select one of the two independently selectable local row portions/segments. Further, if all local array sets (sets=4 in this exemplary embodiment) are associated with a separate I/O, only ⅛th of the memory cells are activated per I/O (because of two Planes per set), thereby resulting in dramatically reduced power consumption on a per I/O basis in this exemplary embodiment.

Based on the foregoing, it should be appreciated that the present invention provides a divided wordline architecture for use with memory compilers that advantageously overcomes the deficiencies and shortcomings of the prior art. In addition to reducing power and RC time delays in large memory arrays, the teachings of the present invention are particularly advantageous for memory compilers. As is well known, it is preferable that control logic circuitry be provided in memory compilers on a per I/O basis due to the variable number of I/Os based on specific applications. By including Set and/or Plane decoding logic in centrally-located MWL decoder stripe 102 (in contrast to the prior art arrangements), the present invention advantageously provides for areas (e.g., reference numeral 112 in FIG. 1) in the sense amplifier and column circuitry bands (e.g., reference numerals 106A and 106B) at the intersections of the bands and the local decoder circuitry 110, wherein control logic circuitry associated with a select local memory array may be placed on a per I/O basis. Furthermore, such localization of control logic circuitry allows better tracking of control signals (i.e., signal skews, etc.), whereby the electrical characteristics of dummy rows and dummy columns, if provided, are better matched with the active memory cells in the array for robust operation.

Additionally, it is believed that the operation and construction of the present invention will be apparent from the foregoing Detailed Description. While the method and circuitry shown and described have been characterized as being preferred, it should be readily understood that various changes and modifications could be made therein without departing from the scope of the present invention as set forth in the following claims. For example, although the presently preferred exemplary embodiments of the present invention have been described with NAND and inverter gate implementations, it should be realized that the wordline selection scheme of the present invention may be practiced with other logic gates also. In addition, whereas a repeating unit of four Plane lines is provided in the first exemplary embodiment of the present invention, it should be apparent that a different number of Plane lines may be utilized in accordance with the teachings of the present invention. Analogously, a different number of Set lines or Set/Plane combinations may be also provided for practicing the present invention. Accordingly, it should be clearly understood that these and other numerous variations, substitutions, additions, re-arrangements, extensions, and modifications are contemplated to be within the ambit of the present invention whose scope is solely limited by the claims set forth below.

What is claimed is:

1. A semiconductor memory circuit, comprising:
   a main array of memory cells organized into a plurality of local memory arrays;
   an integrated centrally located decoder structure for generating a plurality of main wordline signals based on a first portion of wordline address signals and for generating a plurality of Plane signals based on a second portion of said wordline address signals; and
   a local wordline decoder associated with each of said plurality of local memory arrays, said local wordline decoder receiving at least a portion of said plurality of main wordline signals,
   wherein said local wordline decoder generates local wordline select signals for selecting local wordline segments disposed in a select local memory array based on said main wordline signals, said Plane signals, and a select portion of said wordline address signals provided to said local wordline decoder.

2. The semiconductor memory circuit as set forth in claim 1, further comprising a plurality of sense amplifier and column circuitry portions which span said main array horizontally and segment said main array into a plurality of banks, each bank having a portion of said local memory arrays arranged horizontally such that a select sub-portion of one of said plurality of sense amplifier and column circuitry portions is associated with a select local memory array, whereby said local wordline decoders intersect said sense amplifier and column circuitry portions so as to create an area in each of said sense amplifier and column circuitry portions wherein a local control circuitry portion is capable of being placed within said area.

3. The semiconductor memory circuit as set forth in claim 2, wherein said Plane signals drive corresponding Plane lines coupled to said local wordline decoder, and further wherein a select main wordline signal and a select Plane signal are decoded to a select local wordline segment.

4. The semiconductor memory circuit as set forth in claim 3, wherein said Plane lines are repeated along the vertical direction of said main array such that said Plane lines and electrical paths for conducting said main wordline signals alternate in the vertical direction of said array whereby said electrical paths for said main wordlines are routed over every other row of memory cells and said Plane lines are routed over the remaining other rows of memory cells.

5. The semiconductor memory circuit as set forth in claim 3, wherein said local wordline decoder comprises a plurality of logic blocks, each logic block comprising a NAND gate coupled to an inverter, and further wherein the inputs of each NAND gate are coupled to a select main wordline and a select Plane line, and the output of each of said inverters is coupled to a corresponding local wordline segment.

6. The semiconductor memory circuit as set forth in claim 3, wherein said main array comprises a Dynamic Random Access Memory (DRAM) instance in an embedded circuit.

7. The semiconductor memory circuit as set forth in claim 3, wherein said main array comprises a Static Random Access Memory (SRAM) instance in an embedded circuit.

8. The semiconductor memory circuit as set forth in claim 3, wherein said main array comprises an Electrically Programmable Read-Only Memory (EPROM) instance in an embedded circuit.

9. The semiconductor memory circuit as set forth in claim 3, wherein said main array comprises a Flash EPROM instance in an embedded circuit.

10. A semiconductor memory circuit, comprising:
    a main array of memory cells organized into a plurality of local memory arrays;
    an integrated centrally located decoder structure for generating a plurality of main wordline signals based on a first portion of wordline address signals and for generating a plurality of Set signals based on a second portion of said wordline address signals; and
    a local wordline decoder associated with each of said plurality of local memory arrays, said local wordline decoder receiving at least a portion of said plurality of main wordline signals;
    wherein said local wordline decoder generates local wordline signals for selecting local wordlines disposed in a select local memory array based on said main wordline signals, said Set signals and a select portion of said wordline address signals provided to said local wordline decoder.

11. The semiconductor memory circuit as set forth in claim 10, further comprising a plurality of sense amplifier and column circuitry portions which span said main array horizontally and segment said main array into a plurality of banks, each bank having a sub-portion of said local memory arrays arranged horizontally such that a select sub-portion of one of said plurality of sense amplifier and column circuitry portions is associated with local bitlines disposed in a select local memory array, whereby said local wordline decoders intersect said sense amplifier and column circuitry portions so as to create an area in each of said sense amplifier and column circuitry portions, wherein a local control circuitry portion is capable of being placed within said area.

12. The semiconductor memory circuit as set forth in claim 11, wherein local wordline decoder comprises a plurality of logic blocks, each logic block comprising a NAND gate coupled to an inverter, and further wherein the inputs of each NAND gate are coupled to a select main wordline and a select Set line, and the output of each of said inverters is coupled to a corresponding local wordline.

13. The semiconductor memory circuit as set forth in claim 12, wherein said main array comprises a Dynamic Random Access Memory (DRAM) instance in an embedded circuit.

14. The semiconductor memory circuit as set forth in claim 12, wherein said main array comprises a Static Random Access Memory (SRAM) instance in an embedded circuit.

15. The semiconductor memory circuit as set forth in claim 12, wherein said main array comprises an Electrically Programmable Read-Only Memory (EPROM) instance in an embedded circuit.

16. The semiconductor memory circuit as set forth in claim 12, wherein said main array comprises a Flash EPROM instance in an embedded circuit.

17. A semiconductor memory circuit, comprising:
    a main array of memory cells organized into a plurality of local memory arrays;
    an integrated centrally located decoder structure for generating a plurality of main wordline signals, a plurality of Set signals, and a plurality of Plane signals based on wordline address signals provided to said semiconductor memory circuit; and a local wordline decoder associated with each of said plurality of local memory arrays, said local wordline decoder receiving at least a portion of said plurality of main wordline signals;

wherein said local wordline decoder generates local wordline signals for selecting local wordline segments disposed in a select local memory array based on said main wordline signals, said Set signals, said Plane signals and a select portion of said wordline address signals provided to said local wordline decoder.

18. The semiconductor memory circuit as set forth in claim 17, further comprising a plurality of sense amplifier and column circuitry portions which span said main array horizontally and segment said main array into a plurality of banks, each bank having a sub-portion of said local memory arrays arranged horizontally such that a select sub-portion of one of said plurality of sense amplifier and column circuitry portions is associated with local bitlines disposed in a select local memory array, whereby said local wordline decoders intersect said sense amplifier and column circuitry portions so as to create an area in each of said sense amplifier and column circuitry portions, wherein a local control circuitry portion is capable of being placed within said area.

19. The semiconductor memory circuit as set forth in claim 18, wherein local wordline decoder comprises a plurality of logic blocks, each logic block comprising a NAND gate coupled to an inverter, and further wherein the inputs of each NAND gate are coupled to a select main wordline, a select Plane line and a select Set line, and the output of each of said inverters is coupled to a corresponding local wordline segment.

20. The semiconductor memory circuit as set forth in claim 19, wherein said main array comprises a Dynamic Random Access Memory (DRAM) instance in an embedded circuit.

21. The semiconductor memory circuit as set forth in claim 19, wherein said main array comprises a Static Random Access Memory (SRAM) instance in an embedded circuit.

22. The semiconductor memory circuit as set forth in claim 19, wherein said main array comprises an Electrically Programmable Read-Only Memory (EPROM) instance in an embedded circuit.

23. The semiconductor memory circuit as set forth in claim 19, wherein said main array comprises a Flash EPROM instance in an embedded circuit.

* * * * *